United States Patent
Anderson et al.

(10) Patent No.: US 12,457,762 B2
(45) Date of Patent: Oct. 28, 2025

(54) CROSS BAR VERTICAL FETs

(71) Applicant: International Business Machines Corporation, Armonk, NY (US)

(72) Inventors: Brent A. Anderson, Jericho, VT (US);
Junli Wang, Slingerlands, NY (US);
Indira Seshadri, Niskayuna, NY (US);
Ruilong Xie, Niskayuna, NY (US);
Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 803 days.

(21) Appl. No.: 17/644,528

(22) Filed: Dec. 15, 2021

(65) Prior Publication Data
US 2023/0187541 A1     Jun. 15, 2023

(51) Int. Cl.
*H10D 30/01* (2025.01)
*H10D 30/62* (2025.01)
*H10D 64/01* (2025.01)

(52) U.S. Cl.
CPC ..... *H10D 30/0243* (2025.01); *H10D 30/6212* (2025.01); *H10D 64/015* (2025.01)

(58) Field of Classification Search
CPC ........... H10D 30/0243; H10D 30/6212; H10D 64/015
See application file for complete search history.

(56) References Cited

U.S. PATENT DOCUMENTS

| | | | |
|---|---|---|---|
| 7,056,781 B2 | 6/2006 | Yoon et al. | |
| 9,385,193 B2 | 7/2016 | Huang et al. | |
| 9,595,611 B2 | 3/2017 | Kim et al. | |
| 10,340,364 B2 | 7/2019 | Zhang et al. | |
| 10,418,484 B1 | 9/2019 | Xie et al. | |
| 2012/0146157 A1* | 6/2012 | Baumgartner | H10D 30/0245 257/401 |
| 2018/0315857 A1 | 11/2018 | Li | |
| 2019/0148516 A1* | 5/2019 | Zhang | H10D 30/63 257/329 |
| 2019/0393350 A1 | 12/2019 | Thompson et al. | |

FOREIGN PATENT DOCUMENTS

EP     1091413 A2     4/2001

OTHER PUBLICATIONS

Zhang, Yuhao et al. "Trench Formation and Corner Rounding in Vertical GaN Power Devices." Applied Physics Letters 110, 19 (May 2017): 193506.

* cited by examiner

*Primary Examiner* — Christine A Enad
(74) *Attorney, Agent, or Firm* — Patterson + Sheridan, LLP

(57) ABSTRACT

The embodiments herein describe a crossbar VFET where the crossbar channel (or fin) that extends between a pair of channels (fins) has reduced corner rounding, or no corner rounding. This can be achieved by developing a masking feature before etching the channels in the VFET that results in reduced, or no corner rounding in the channel structure etched using the masking feature.

9 Claims, 14 Drawing Sheets

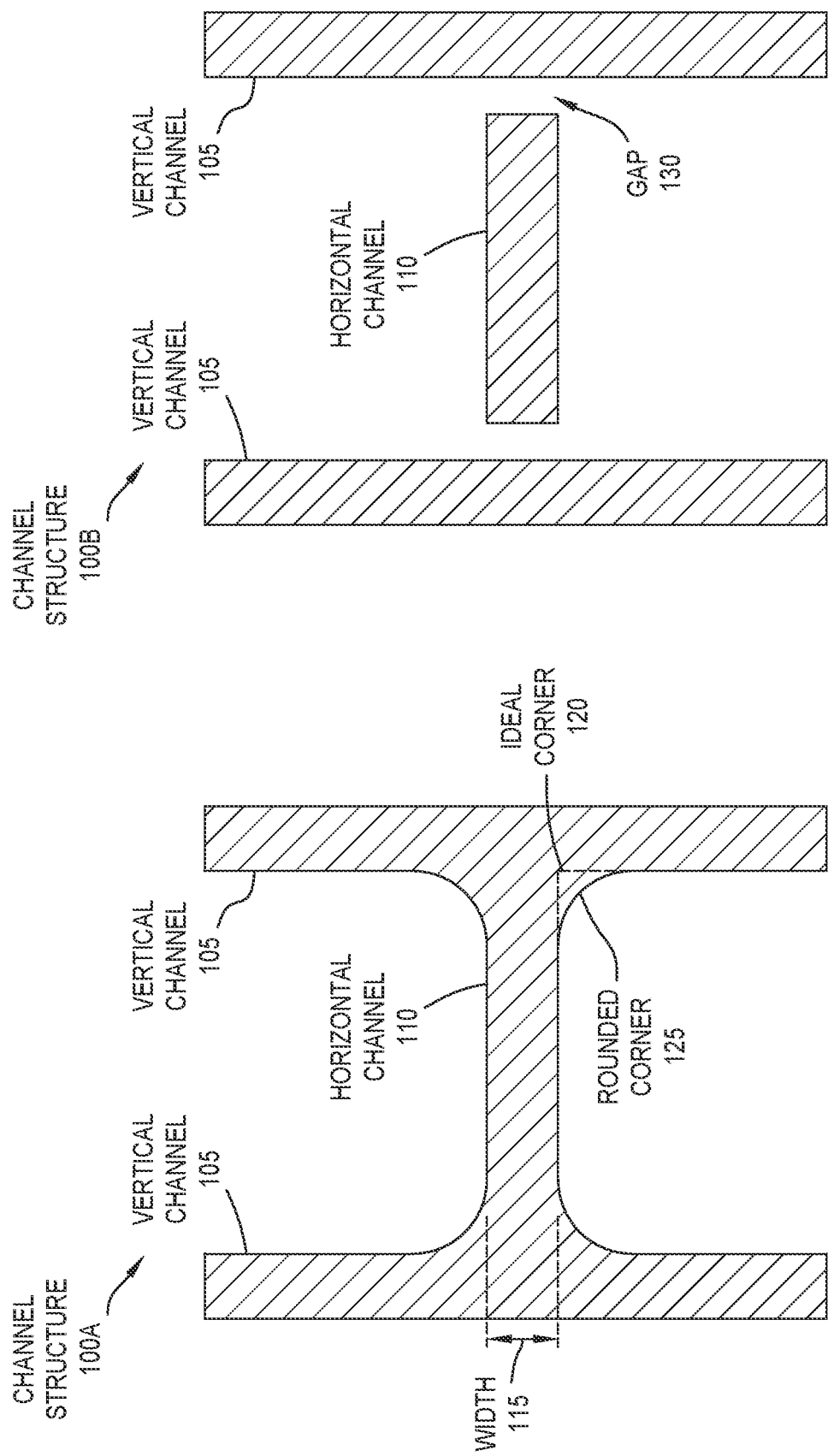

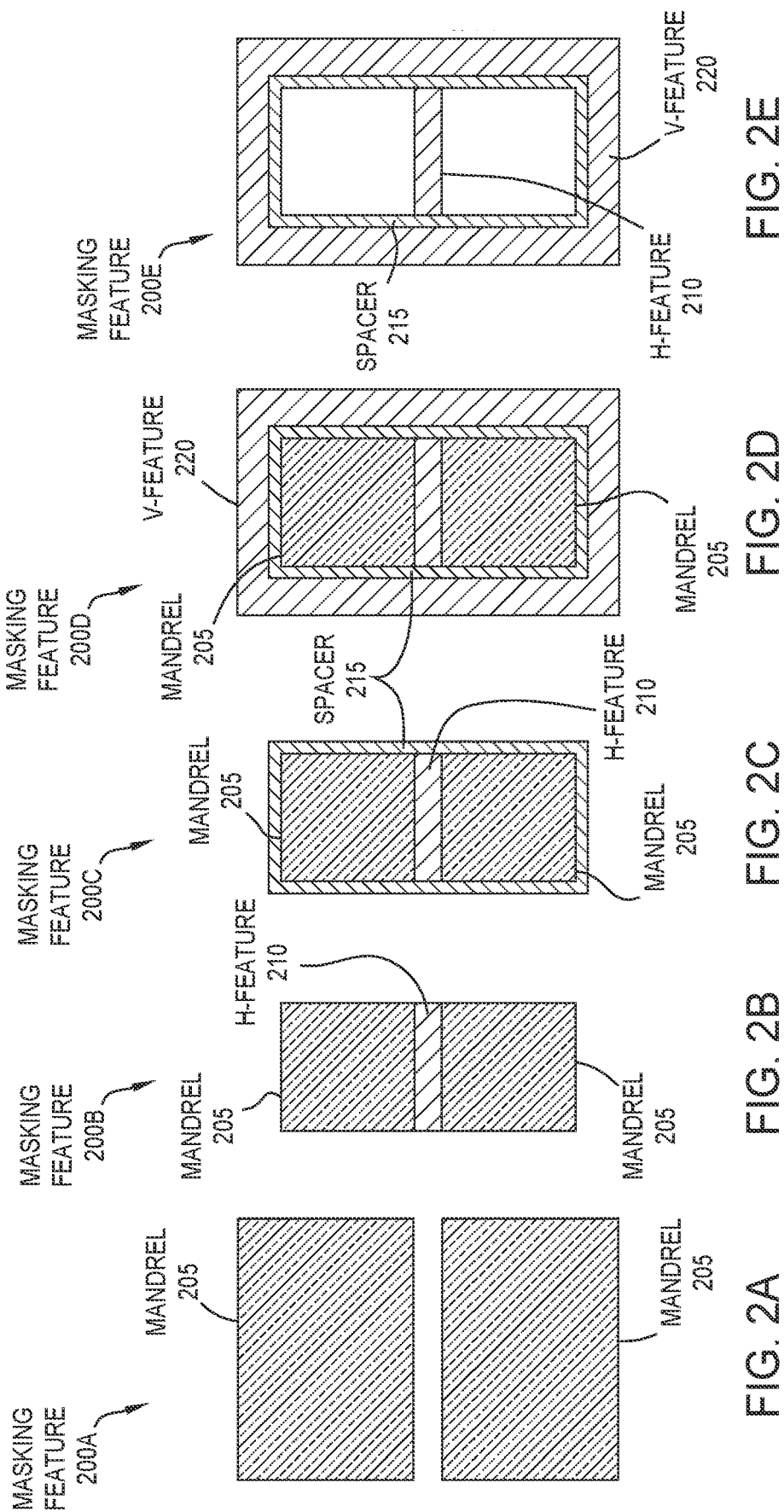

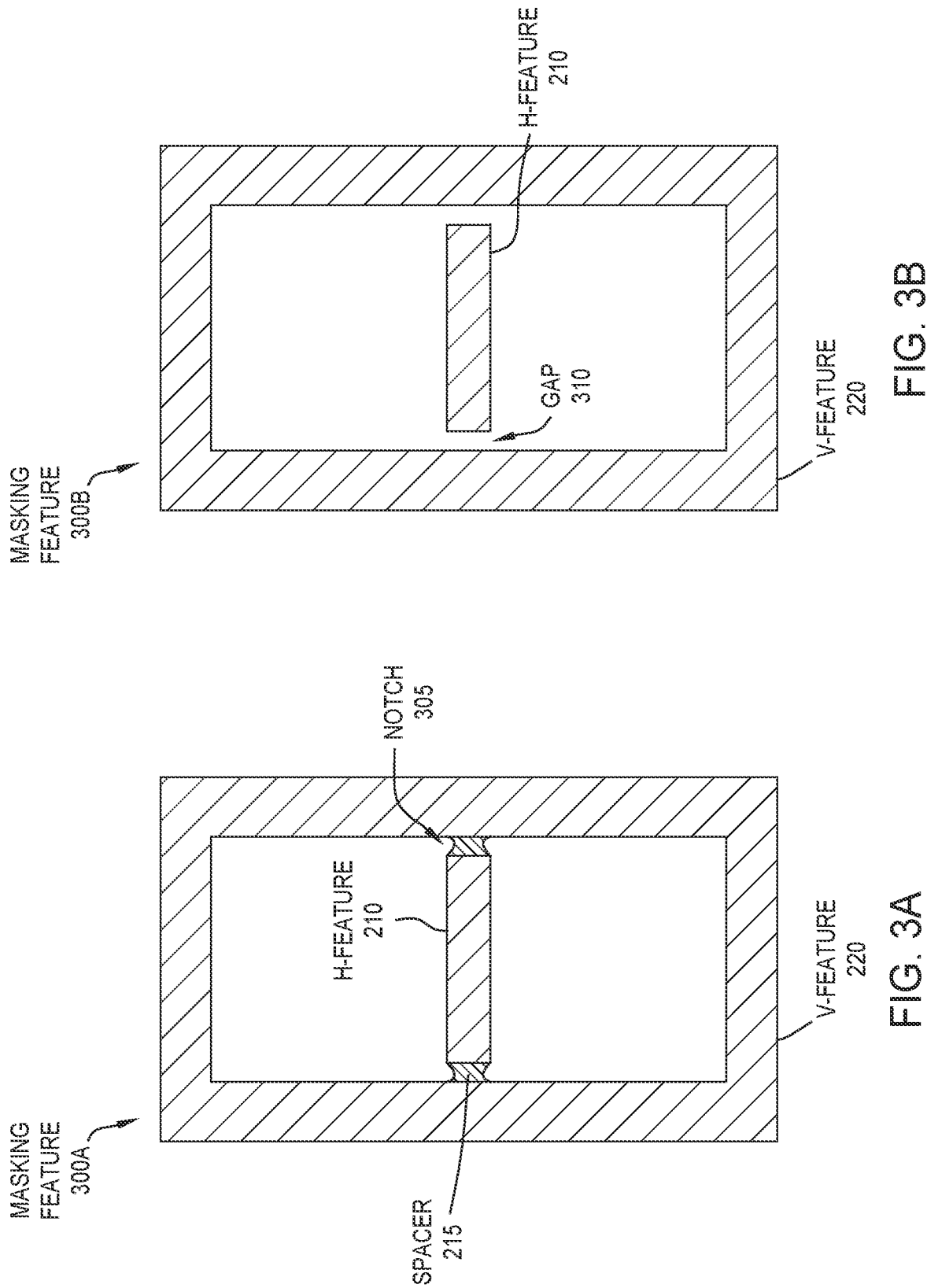

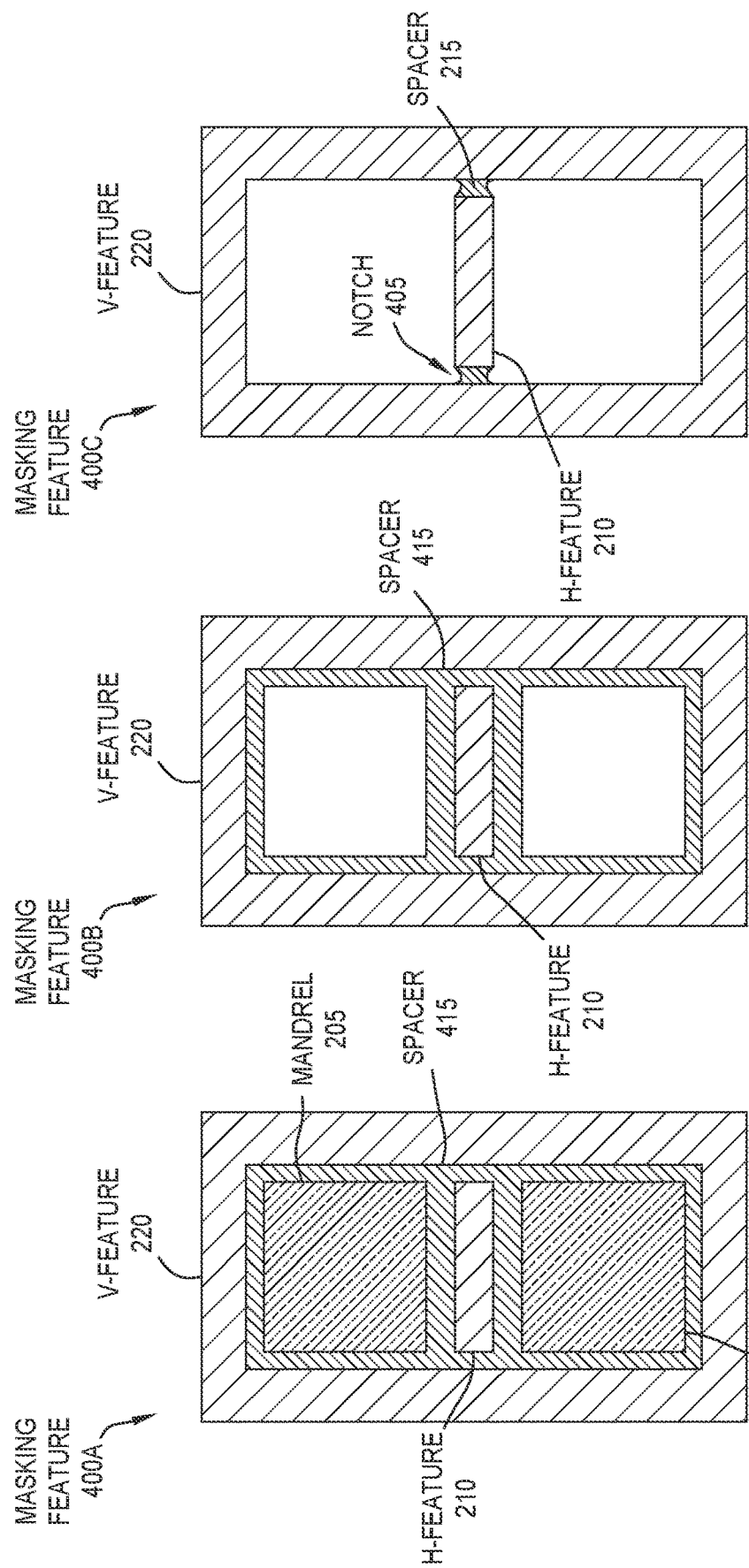

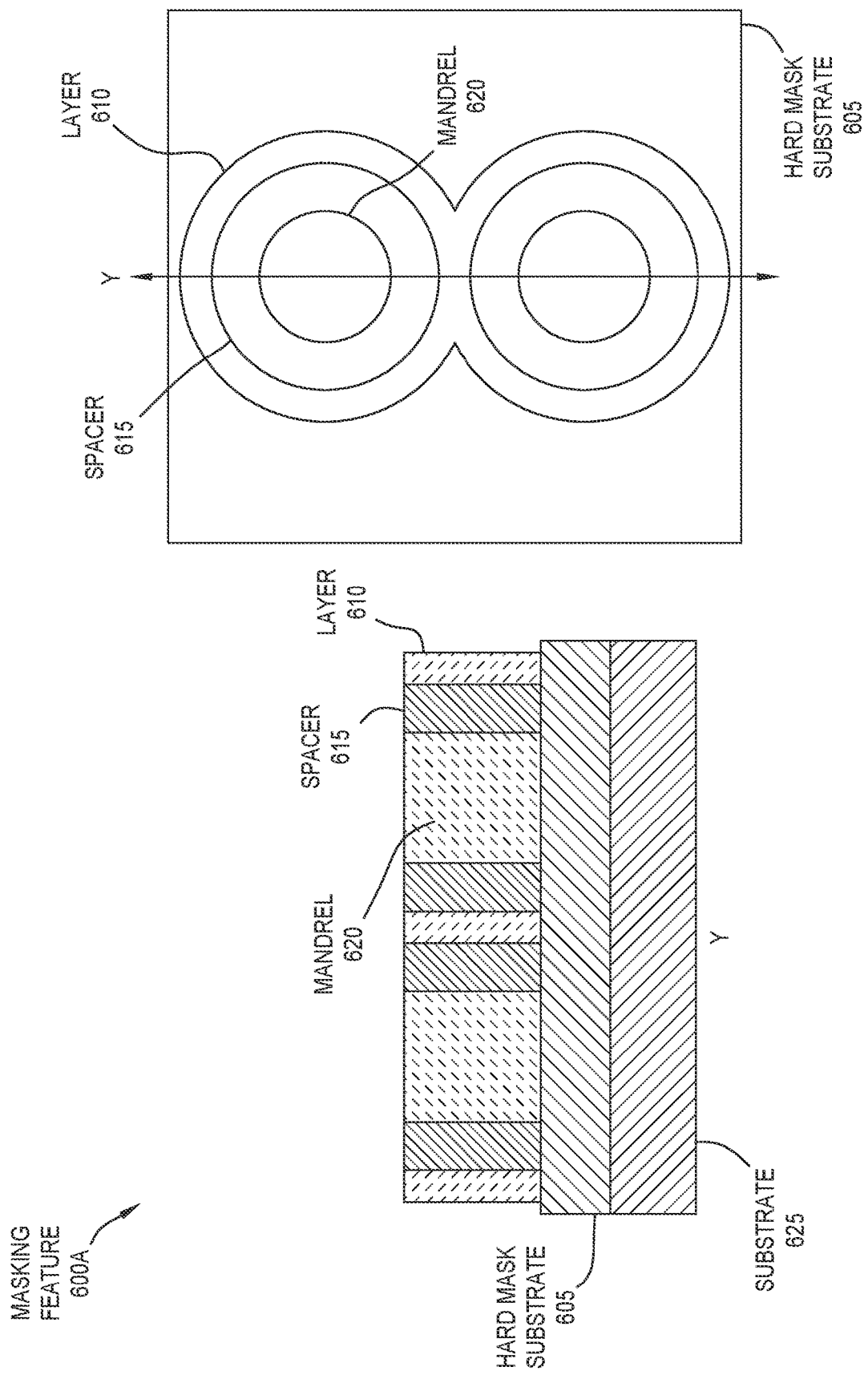

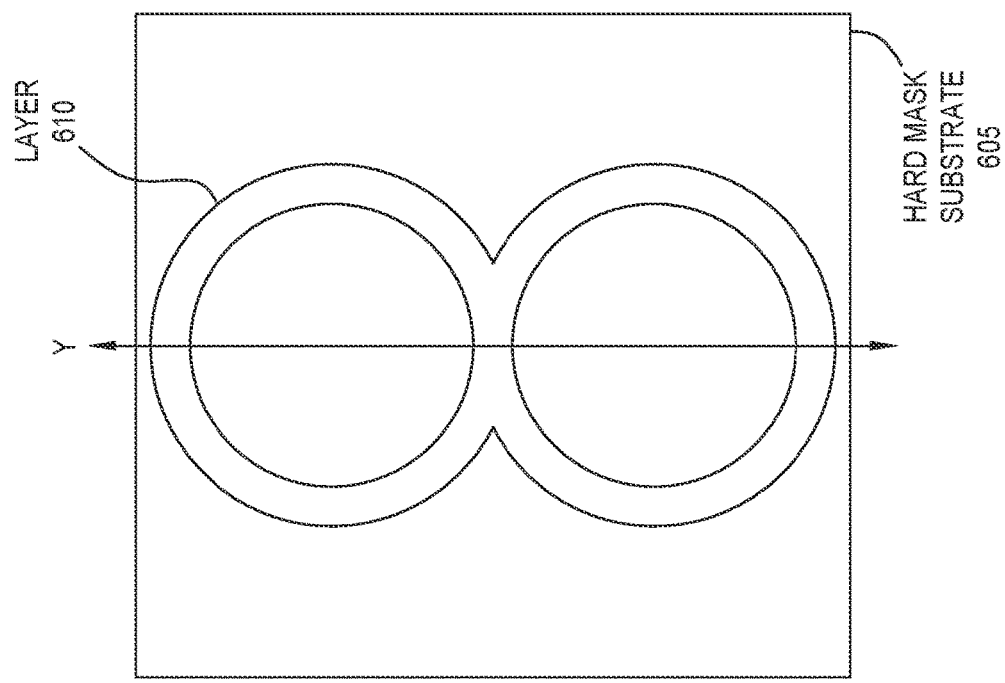
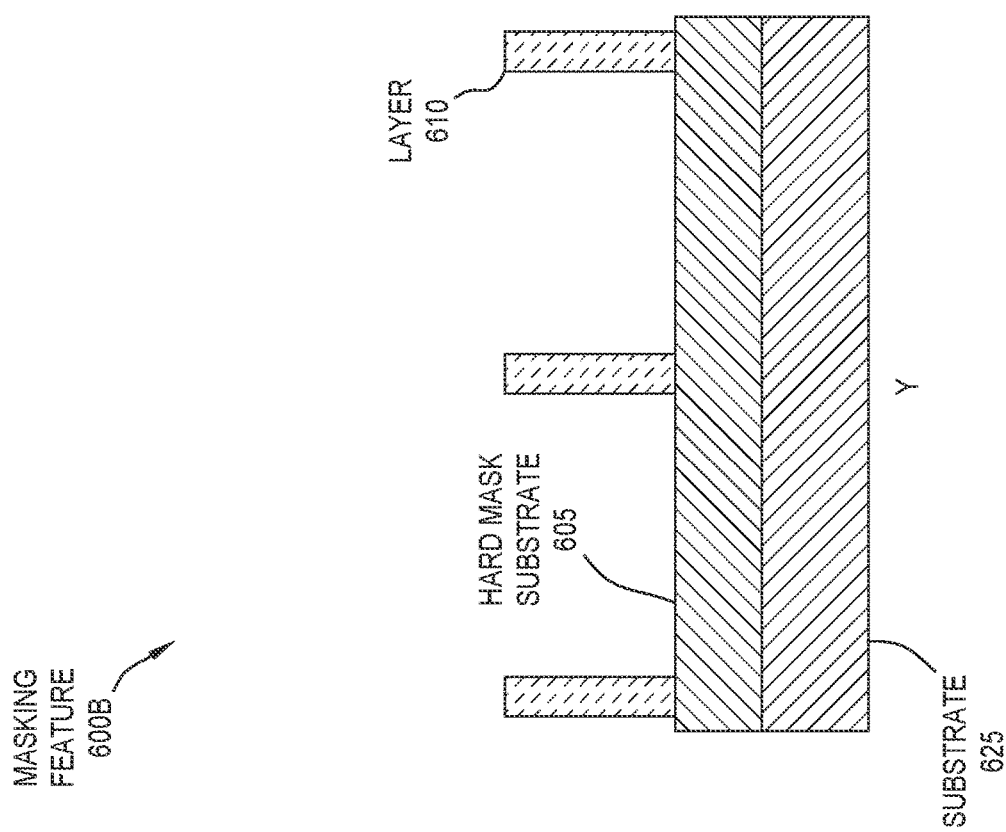
FIG. 6B

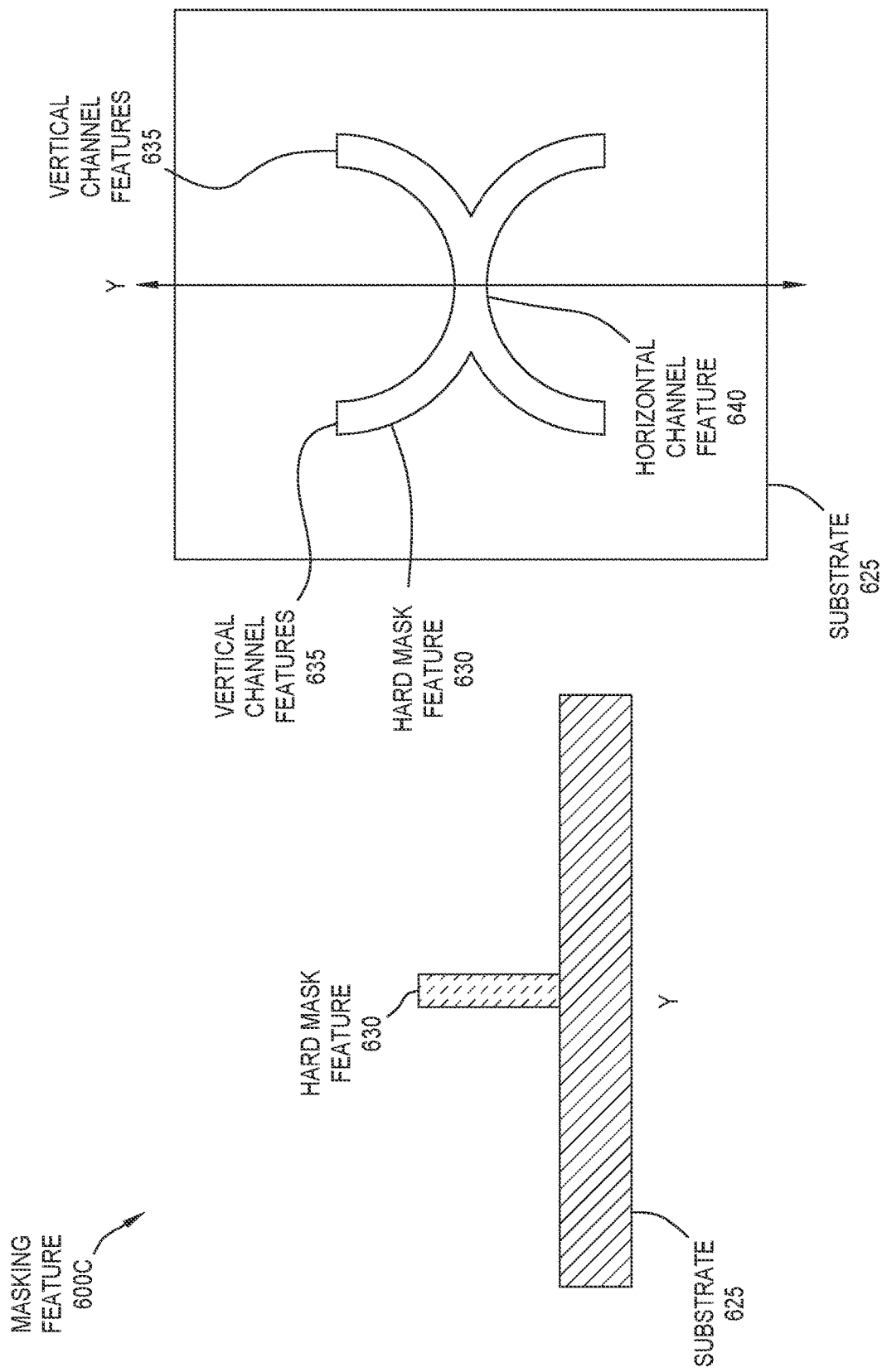

US 12,457,762 B2

CROSS BAR VERTICAL FETs

BACKGROUND

The present invention relates to minimizing or removing corner rounding between perpendicular channels in a vertical field-effect transistor (VFET).

A Gate-All-Around FET such as a Vertical-Transport-FET is one of the lead device architectures for continuing CMOS scaling beyond Horizontal-Transport Devices. New VFET designs includes a pair of channels extending in a first direction while a channel extends between the pair of channels in a second, perpendicular direction to form a cross bar. However, fabrication techniques used to generate these crossbar VFETs result in rounded corners where the crossbar channel contacts the pair of channels. These rounded corners can have a negative impact on the performance of the VFET.

SUMMARY

According to one embodiment of the present invention, a VFET includes a channel structure that includes a pair of vertical channels extending in a first direction and a horizontal channel disposed between the pair of vertical channels and extending in a second direction substantially perpendicular to the first direction, where one of (i) gaps separate ends of the horizontal channel from the pair of vertical channels or (ii) the ends of the horizontal channel contact the pair of vertical channels but have a reduced width relative to a width of a middle portion of the horizontal channel. The VFET also includes a source region and a drain region coupled to the channel structure.

Another embodiment of the present invention is a VFET including a channel structure that includes a pair of vertical channels extending in a first direction and a horizontal channel extending in a second direction substantially perpendicular to the first direction, the horizontal channel comprising two ends contacting a respective one of the pair of vertical channels, wherein the two ends form rounded corners with the pair of vertical channels, wherein the furthest distance on the rounded corners to an ideal corner between the horizontal channel and the pair of vertical channels is at least one of (i) less than 5 nm or (ii) less than a width of the horizontal channel. The VFET also includes a source region and a drain region coupled to the channel structure.

Another embodiment of the present invention is a method that includes forming, in a masking feature, mandrels with a gap therebetween, forming, in the masking feature, a horizontal feature where the horizontal feature is in the gap, forming, in the masking feature, a vertical feature around the mandrels, removing the mandrels from the masking feature, and etching, using the masking feature, a substrate to form a fin structure for a VFET.

BRIEF DESCRIPTION OF THE DRAWINGS

FIGS. 1A-1D illustrate different channel structures of a crossbar VFET with reduced, or no, rounded corners, according to embodiments herein.

FIGS. 2A-2E illustrate forming a masking feature for forming channels in a crossbar VFET, according to embodiments herein.

FIGS. 3A-3B illustrate forming masking features from the masking feature in FIG. 2E, according to embodiments herein.

FIGS. 4A-4C illustrate forming a masking feature for forming channels in a crossbar VFET, according to embodiments herein.

FIGS. 6A-6C illustrate forming a masking feature for forming channels in a crossbar VFET, according to embodiments herein.

DETAILED DESCRIPTION

Figure 1D:
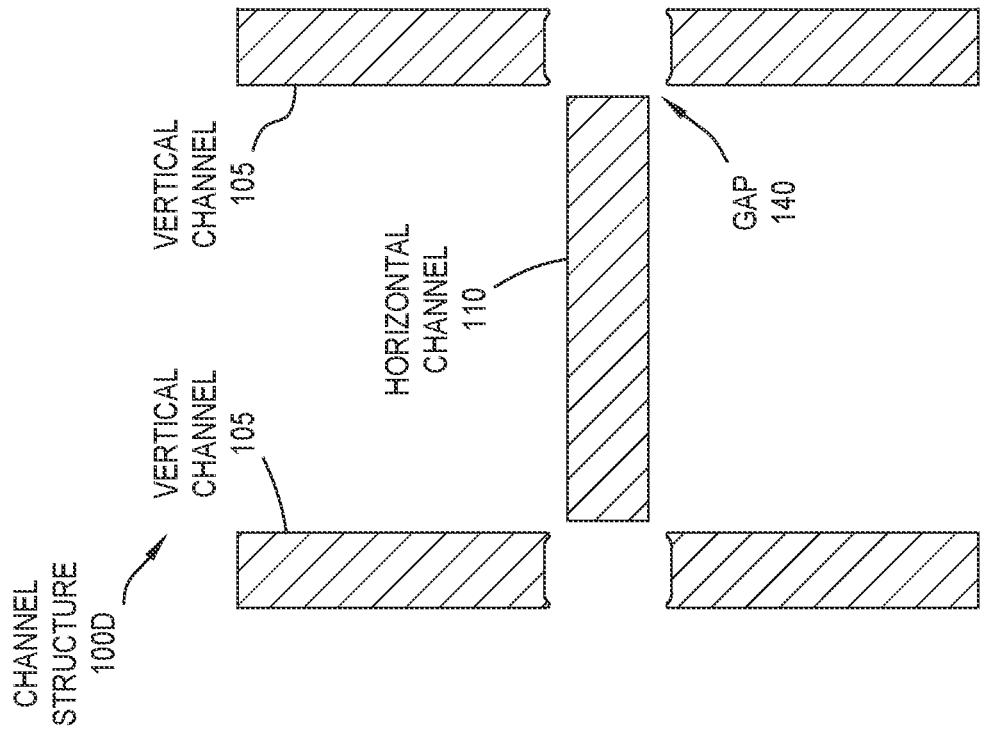

The embodiments herein describe a crossbar VFET where the crossbar channel (or fin) that extends between a pair of channels (fins) has reduced corner rounding, or no corner rounding. This can be achieved by developing a masking feature before etching the channels in the VFET. In some embodiments, the masking feature can have a reduced thickness where a horizontal feature of the masking feature intersects with a pair of vertical features. As a result, when a substrate is etched using the masking feature, the crossbar channel (or fin) has a reduced rounder corner, or no rounded corners.

In another embodiment, the masking feature has a gap between the horizontal feature of the masking feature and the vertical, parallel features. This can eliminate the reduce or eliminate rounded corners in the resulting crossbar channel. In one embodiment, the gap in the masking feature can result in the crossbar channel also being separated from the pair of parallel channels by a gap.

In another embodiment, the masking feature has gaps in the pairs of the vertical parallel features where these features align with the horizontal feature of the masking feature. As a result, the channels or fins formed from this masking feature may also have gaps in the pair of vertical channels where they align with crossbar channel. Thus, because the crossbar channel is aligned with the gaps in the pair of channels this also avoids rounded corners.

FIGS. 1A-1D illustrate different channel structures of a crossbar VFET with reduced, or no, rounded corners, according to embodiments herein. FIGS. 1A-1D are top down views of different channel structures 100 (also referred to as fin structures) for a crossbar VFET. Although not shown, a gate (e.g., a high-k conductive material) can be formed around the periphery of the different channel structures 100 in FIGS. 1A-1D. Thus, a single gate voltage can be used to control the channel structures 100. Further, conductive contacts can be formed at the top and bottom of the channel structures 100 (relative to a direction into and out of the page) that couple or connect the channels to source/drain (S/D) regions.

The channel structure 100A in FIG. 1A includes two vertical channels 105 with a horizontal channel 110 extending between them. As used herein, the term "vertical" and "horizontal" are relative to the top down view. Both the horizontal and vertical channels 105, 110, when viewed from the side, form vertical fins for the VFET.

The vertical channels 105 are substantially parallel and extend in a first direction. The horizontal channel 110, in contrast, extends in a second direction that is perpendicular to the first direction. In one embodiment, the vertical and horizontal channels 105, 110 are formed from the same material (e.g., a semiconductor). However, in other embodiments, the vertical channels 110 and the horizontal channel 105 are formed from different materials. For example, the vertical channels 105 may be formed from a first material while the horizontal channel 110 is formed from a different material.

In the channel structure 110A, the horizontal channel 110 contacts both of the two vertical channels 105. In this case, the intersection between the horizontal channel 110 and the vertical channels 105 forms rounded corners 125 rather than having an ideal corner 120. That is, instead of forming a perpendicular corner between the horizontal channel 110 and the vertical channels 105, this intersection is rounded. As mentioned above, this rounded corner 125 can have a negative impact on the performance of the VFET. Specifically, as the rounded corner 125 increases (e.g., deviates from the ideal corner 120) the thickness of the horizontal channel 110 increases at the location it intersects with the vertical channels 105. Ideally, the thickness of the horizontal channel 110 (and the vertical channels 105) is the same along its length. The increased thickness caused by the rounded corners 125 can result in the center of the horizontal channel being farther away from the gate (not shown) which is disposed on the periphery of the vertical channels 110 and the horizontal channel 105. This can mean this center portion might not behave the same as the rest of the channel 110 when the gate voltage is changed (e.g., when the VFET is switched on and off) and can result in leakage current.

In FIG. 1A, the size of the rounded corner 125 is reduced relative to previous channel structures so as to not negatively impact the performance of the VFET. In one embodiment, the furthest distance on the rounded corner 125 to the ideal corner 120 is less than 5 nm, or alternatively, less than a width 115 of the horizontal channel 110 or the widths of the vertical channels 105. If this parameter is satisfied when fabricating the channel structure 110A, then the rounded corner 125 has a limited impact, or no adverse impact, on the operation of the VFET. As will be discussed in more detail below, a masking feature can be used when fabricating the channel structure 100A so that the rounded corner 125 is either less than 5 nm or less than the width 115. In this manner, the channel structure 100A is an improvement of other crossbar VFETs with rounded corners 125.

The channel structure 100B in FIG. 1B includes two vertical channels 105 with a horizontal channel 110 extending between them. The vertical channels 105 are substantially parallel and extend in a first direction. The horizontal channel 110, in contrast, extends in a second direction that is perpendicular to the first direction. In one embodiment, the vertical channels 110 and the horizontal channel 105 are formed from the same material (e.g., a semiconductor). However, in other embodiments, the vertical channels 110 and the horizontal channel 105 are formed from different materials. For example, the vertical channels 105 may be formed from a first material while the horizontal channel 110 is formed from a different material.

Unlike in FIG. 1A, in the channel structure 100B the horizontal channel 110 does not directly contact the vertical channels 105. Instead there is a gap 130 between the horizontal channel 110 and the vertical channels 105. This gap 130 can be filled with either a spacer material, or can be filled with the material of the gate.

The channel structure 100B avoids any negative impact of rounded corners by having the gap 130. Thus, the channel structure 100B has the advantage of the crossbar channel design (e.g., a higher density of fins relative to other VFETs) but avoids the rounded corners. As will be discussed in more detail below, a masking feature can be used when fabricating the channel structure 100B so that the gaps 130 are formed between the horizontal channel 110 and the vertical channels 105. That is, the ends of the horizontal channel are in facing relationships with respective sides of the vertical channels 105. In this manner, the channel structure 100B is an improvement of other crossbar VFETs with rounded corners.

Figure 1C:
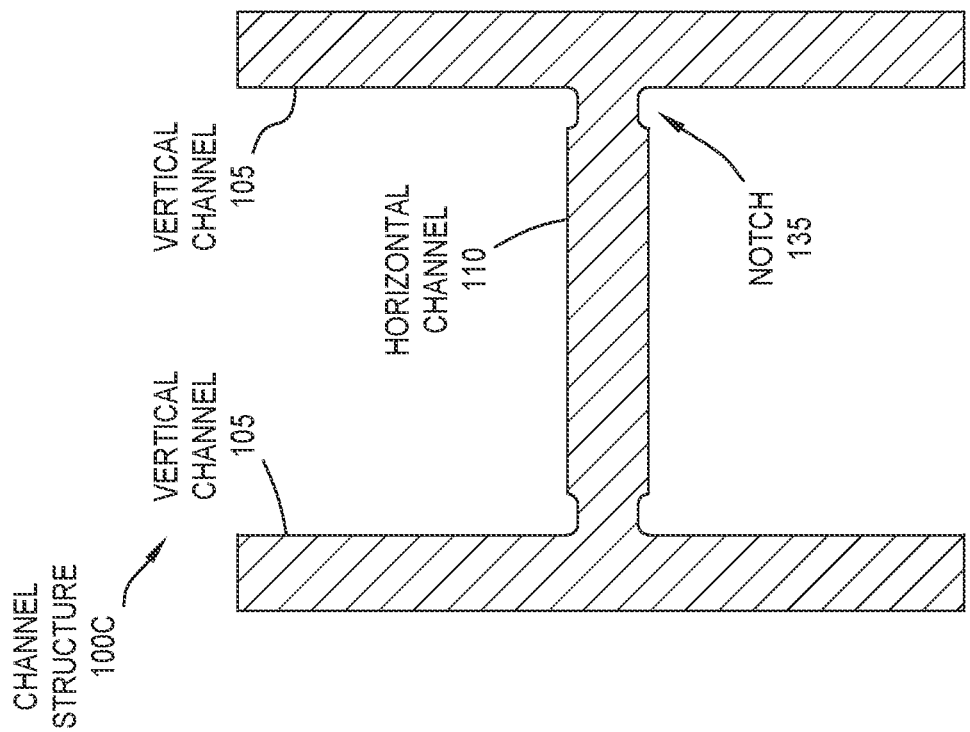

The channel structure 100C in FIG. 1C includes two vertical channels 105 with a horizontal channel 110 extending between them. The vertical channels 105 are substantially parallel and extend in a first direction. The horizontal channel 110, in contrast, extends in a second direction that is perpendicular to the first direction. In one embodiment, the vertical channels 110 and the horizontal channel 105 are formed from the same material (e.g., a semiconductor). However, in other embodiments, the vertical and horizontal channels 105, 110 are formed from different materials. For example, the vertical channels 105 may be formed from a first material while the horizontal channel 110 is formed from a different material.

In the channel structure 110C, the horizontal channel 110 contacts both of the two vertical channels 105 like the channel structure 100A in FIG. 1A. However, in this embodiment, the intersection between the horizontal channel 110 and the vertical channels 105 does not include rounded corners. Instead, the horizontal channel 110 includes notches 135 at the ends contacting the vertical channels 105. These notches 135 result in the channel structure 100C avoiding the performance issues caused by round corners increasing the thickness of the horizontal channel 110. Indeed, the notches 135 reduce the width of the horizontal channel 110 at its ends. That is, the width of the horizontal channel 110 at the ends is less than a width of a middle portion of the horizontal channel 110 between the ends. As will be discussed in more detail below, a masking feature can be used when fabricating the channel structure 100C so that the notches 135 are formed at the intersections between the horizontal channel 110 and the vertical channels 105. In this manner, the channel structure 100C is an improvement of other crossbar VFETs with rounded corners.

The channel structure 100D in FIG. 1D includes two vertical channels 105 with a horizontal channel 110 extending between them. The vertical channels 105 are substantially parallel and extend in a first direction. The horizontal channel 110, in contrast, extends in a second direction that is perpendicular to the first direction. In one embodiment, the vertical and horizontal channels 105, 110 are formed from the same material (e.g., a semiconductor). However, in other embodiments, the vertical channels 110 and the horizontal channel 105 are formed from different materials. For example, the vertical channels 105 may be formed from a first material while the horizontal channel 110 is formed from a different material.

In the channel structure 110D, each of the vertical channels 105 include gaps 140 between upper portions and lower portions of the vertical channels 105. Specifically, the gaps 140 are disposed in the vertical channels 105 at regions that align with the horizontal channel 110. Stated oppositely, when extending between the vertical channels 105, the horizontal channel 110 aligns with the gaps 140 in the vertical channels 105. Because the horizontal channel 110 is aligned with the gaps 140, the channel structure 110D avoids having rounded corners on the channel 110. Thus, the channel structure 100D has the advantage of the crossbar channel design (e.g., a higher density of fins relative to other VFETs) but avoids the rounded corners. As will be discussed in more detail below, a masking feature can be used when fabricating the channel structure 100D so that the gaps 140 are formed at regions within the vertical channels 105 that align with the horizontal channel 110. In this manner, the channel structure 100D is an improvement of other crossbar VFETs with rounded corners.

While FIGS. 1A-1D have channel structures 100 with H-shapes, the embodiments herein are not limited to such. For example, instead of the horizontal channel 110 being aligned at the middle of the vertical channels 105, the channel 110 may instead be shifted up or down relative to the structures shown in FIGS. 1A-1D. In one embodiment, the channel structures 100 can form a U structure, or an upside down U structure, where the horizontal channel 110 aligns with the upper or lower ends of the vertical channels 105. Generally, the embodiments herein can be applied to any channel structure where a horizontal channel 110 extends between vertical channels 105 with reduced sized rounded corners, or no rounded corners.

Moreover, the horizontal channel 110 may extend in a direction that is not precisely perpendicular, but is substantially perpendicular, to the direction in which the vertical channels 105 extend. For example, the horizontal channel 110 may be at a slight angle (e.g., a few degrees) relative to a direction that is perpendicular to the vertical channels 105.

FIGS. 2A-2E illustrate forming a masking feature for forming channels in a crossbar VFET at the same time using the masking feature. For clarity, FIGS. 2A-2E illustrate various fabrication steps for forming a masking feature without showing other layers such as a substrate on which the feature 200 is formed. Moreover, the FIGS. 2A-2E all illustrate top down views of the masking feature 200

In FIG. 2A, mandrels 205 of the masking feature 200A are formed on the substrate. The mandrels 205 can be formed from any material that can be selectively etched from other materials, which is performed in a later processing step. For example, the mandrels 205 may be formed from SiGe which can be selectively etched from other materials typically used in semiconductor fabrication such as SiN, oxides, Si, and the like.

In FIG. 2B, a horizontal-feature (H-feature) 210 of the masking feature 200B is formed in a space between the mandrels 205. That is, the space between the mandrels 205 defines the width of the H-feature 210 in the vertical direction in FIG. 2B. The H-feature 210 will be used in later processing steps to form the horizontal channel/fin in a crossbar VFET—e.g., the horizontal channels 110 shown in FIGS. 1A-1D. In one embodiment, the H-feature 210 if formed from SiN.

In FIG. 2C, a spacer 215 of the masking feature 200C is formed around the exposed periphery of the mandrels 205 and the H-feature 210. The spacer 215 can be formed from any material that can be selectively etched relative to the other materials in the masking feature 200C, which is performed in a later processing step. For example, the spacer 215 may be formed from a material that can be selectively etched relative to the material of the mandrels 205 and the H-feature 210.

In FIG. 2D, a vertical-feature (V-feature) 220 of the masking feature 200D is formed around the periphery of the spacer 215. In one embodiment, the V-feature 220 is made from the same material as the H-feature (e.g., SiN). Further, the V-feature 220 will be used in later processing steps to form the vertical channels/fins in a crossbar VFET—e.g., the vertical channels 105 shown in FIGS. 1A-1D.

The spacer 215 establishes a distance between the ends of the H-feature 210 and the sides of the V-feature 220. This distance can be changed depending on what type of channel structure 100 shown in FIGS. 1A-1D will be fabricated using the masking feature 200.

In FIG. 2E, the mandrels 205 are removed to form the masking feature 200E. That is, a selective etch can be performed to remove the mandrels 205 without etching the remaining structures in the masking feature 200E—i.e., the H-feature 210, the spacer 215, and the V-feature 220.

After this point, the processing method in FIGS. 2A-2E can branch to form alternative masking features. These alternative masking features are illustrated in FIGS. 3A and 3B.

FIGS. 3A-3B illustrate forming a masking feature from the masking feature in FIG. 2E, according to embodiments herein. Both FIGS. 3A and 3B illustrate masking features that can be formed from the masking feature 200E in FIG. 2E.

In FIG. 3A, the masking feature 200E in FIG. 2E is etched to remove the spacer 215 such that the spacer 215 is only disposed in a region between the ends of the H-feature 210 and the V-feature 220. Doing so forms a masking feature 300A where the spacer 215 is over etched in this region so that notches 305 are formed in the spacer 215. Stated differently, the spacer 215 is etched so that its width/thickness is less than the width/thickness of the H-feature 210. As mentioned above, the material of the spacer 215 can be selected so that this etching process does not materially affect the H-feature 210 and the V-feature 220.

In FIG. 3B, the masking feature 200E in FIG. 2E is etched to entirely remove the spacer 215 in order to form the masking feature 300B. That is, in contrast to the masking feature 300A, the masking feature 300B does not include any remaining material of the spacer 215. Doing so forms gaps 310 between the ends of the H-feature 210 and the V-feature 220. As mentioned above, the material of the spacer 215 can be selected so that this etching process does not materially affect the H-feature 210 and the V-feature 220.

The masking features 300A and 300B can then be used to etch the underlying substrate or layers to form the channel structures 100 (or fin structures) in FIGS. 1A-1D. For example, the masking feature 300A may be better suited to form some of the channel structures 100, while the masking feature 300B is better suited to form other ones of the channel structures 100.

In one embodiment, the masking feature 300A in FIG. 3H is used to form the channel structure 100A in FIG. 1A. That is, because the masking feature 300A includes the spacer 215 between the H-feature 210 and the V-feature 220, when the underlying substrate is etched to form the channel structure 100A the horizontal channel 110 contacts the vertical channels 105.

Further, this intersection between the channels 105 and 110 results in the rounded corner 125. However, because the masking feature 300A includes the notches 305, the masking feature 300A reduces the size of the rounded corners 125 relative to other crossbar VFETs formed without the masking feature 300A. In one embodiment, the depth or size of the notches 305 can affect the size of the rounded corners 125. For example, the depth of the notches 305 can be set so that the rounded corners 125 in the resulting channel structure 100A is less than 5 nm, or less than the thickness of the horizontal channel 110, relative to an ideal corner, to avoid the rounded corners 125 having a negative impact on the performance of the VFET containing the channel structure 100A.

In some embodiments, the masking feature 300A is used to form the channel structure 100C in FIG. 1C. That is, because the masking feature 300A includes the spacer 215 between the H-feature 210 and the V-feature 220, when the underlying substrate is etched to form the channel structure 100A the horizontal channel 110 contacts the vertical channels 105. However, because the masking feature 300A includes the notches 305, the masking feature 300A can avoid forming rounded corners in the channel structure 100C. Instead, the channel structure 100C includes the notches 135 which result from the notches 305.

In one embodiment, the depth of the notches 305 can affect the size of the notches 135. For example, the depth of the notches 305 can be set to form notches 135 in the channel structure (which may have a different depth than the notches 305), to avoid the rounded corners, and thus, avoid having a negative impact on the performance of the VFET containing the channel structure 100C. Alternatively, decreasing the depth of the notches 305 can result in the channel structure having rounding corners as shown in FIG. 1A.

In some embodiments, the masking feature 300B in FIG. 3B is used to form the channel structure 100A in FIG. 1A. That is, even though the masking feature 300B includes the gap 310 between the H-feature 210 and the V-feature 220, when the underlying substrate is etched to form the channel structure 100A, the horizontal channel 110 contacts the vertical channels 105. Thus, the horizontal and vertical channels 105, 110 in the channel structure 100A can still contact each other even though there is a gap 310 between the corresponding structures in the masking feature 300B.

Further, the gap 310 in the masking feature 300B can result in the channel structure 100A containing the rounded corners 125. In one embodiment, the size of the gaps 310 can affect the size of the rounded corners 125. For example, the width of the gaps 310 can be set so that the rounded corners 125 in the resulting channel structure 100A is less than 5 nm, or less than the thickness of the horizontal channel 110, relative to the ideal corner, to avoid the rounded corners 125 having a negative impact on the performance of the VFET containing the channel structure 100A.

In some embodiments, the masking feature 300B is used to form the channel structure 100B in FIG. 1B. That is, because the masking feature 300B includes the gaps 310 between the H-feature 210 and the V-feature 220, when the underlying substrate is etched to form the channel structure 100B the horizontal channel 110 is separated at its ends from the vertical channels 105 by the gaps 130.

In one embodiment, the width of the gap 310 in the masking feature 300B affects the width of the gaps 130 in the channel structure 100B. For example, the width of the gap 310 can be set to form at least some gap 130 in the channel structure 100B (which may be smaller than the gap 310), to avoid any rounded corners, and thus, avoid having a negative impact on the performance of the VFET containing the channel structure 100B.

In some embodiments, the masking feature 300B is used to form the channel structure 100C in FIG. 1C. That is, because the masking feature 300B includes the gaps 310 between the H-feature 210 and the V-feature 220, when the underlying substrate is etched to form the channel structure 100C the horizontal channel 110 contacts the vertical channels 105. However, because the masking feature 300B includes the gaps 310, the masking feature 300B can avoid forming rounded corners in the channel structure 100C. Instead, the channel structure 100C includes the notches 135 which result from the gaps 310.

In one embodiment, the width of the gaps 310 can affect the size of the notches 135. For example, the width of the gaps 310 can be set to form the notches 135 in the channel structure 100C to avoid the rounded corners, and thus, avoid having a negative impact on the performance of the VFET containing the channel structure 100C. In this manner, controlling the gaps 310 in the masking feature 300B can determine whether the underlying channel structure has one of the channel structures 100A-C shown in FIGS. 1A-1C.

FIGS. 4A-4C illustrate forming a masking feature for forming channels in a crossbar VFET, according to embodiments herein. In one embodiment, FIGS. 4A-4C illustrate a process for forming a masking feature 400 that can be used to form a channel structure in an underlying substrate. Specifically, FIGS. 4A-4C illustrate an alternative technique for forming the masking feature 300A shown in FIG. 3A. Moreover, FIGS. 4A-4C are top down views.

FIG. 4A illustrates a masking feature 400A similar to the masking feature 200D in FIG. 2D. However, instead of a spacer being disposed only at a periphery of the mandrels 205, in FIG. 4A, a spacer 415 is also disposed between both the mandrels 205 and the H-feature 210.

In FIG. 4B, the mandrels 205 are removed to form the masking feature 400B. That is, a selective etch can be performed to remove the mandrels 205 without etching the remaining structures in the masking feature 200E—i.e., the H-feature 210, the spacer 415, and the V-feature 220.

In FIG. 4C, the masking feature 400B in FIG. 4B is etched to remove most of the spacer 415 such that the spacer 415 is only disposed in a region between the ends of the H-feature 210 and the V-feature 220. Doing so forms a masking feature 400C where the spacer 415 is over etched in this region so that notches 405 are formed in the spacer 415. Stated differently, the spacer 415 is etched so that its width/thickness is less than the width/thickness of the H-feature 210. As mentioned above, the material of the spacer 415 can be selected so that this etching process does not materially affect the H-feature 210 and the V-feature 220.

Having the spacer 415 disposed on all sides of the H-feature 210 may help to form the notch 405 in the spacer 415 because the extra material between the mandrel 205 and H-feature 210 delays the etching of the corner region to provide improved process control. If this extra material is not there, then when etching to remove the perimeter material it may over-etch the corner region and reduce control of the notch 405. In this manner, the processing method in FIGS. 4A-4C can be used to form the masking feature 400C that is substantially the same as the masking feature 300A in FIG. 3A. Thus, the masking feature 400C can be used to form one or more of the channel structures 100 in FIGS. 1A-1C as mentioned above.

While the masking features 300A, 300B, and 400C can be used to form the channel structures 100A-100C in FIGS. 1A-1C, a different masking feature can be used to form the channel structure 100C in FIG. 1D. This is described in FIGS. 5A-5F.

FIGS. 5A-5F illustrate forming a crossbar VFET, according to embodiments herein. In one embodiment, the fabrication process illustrated in FIGS. 5A-5F can be used to form the channel structure 110D in FIG. 1D where the horizontal channel 110 is aligned with gaps 140 in the vertical channels 105.

Figure 5A:
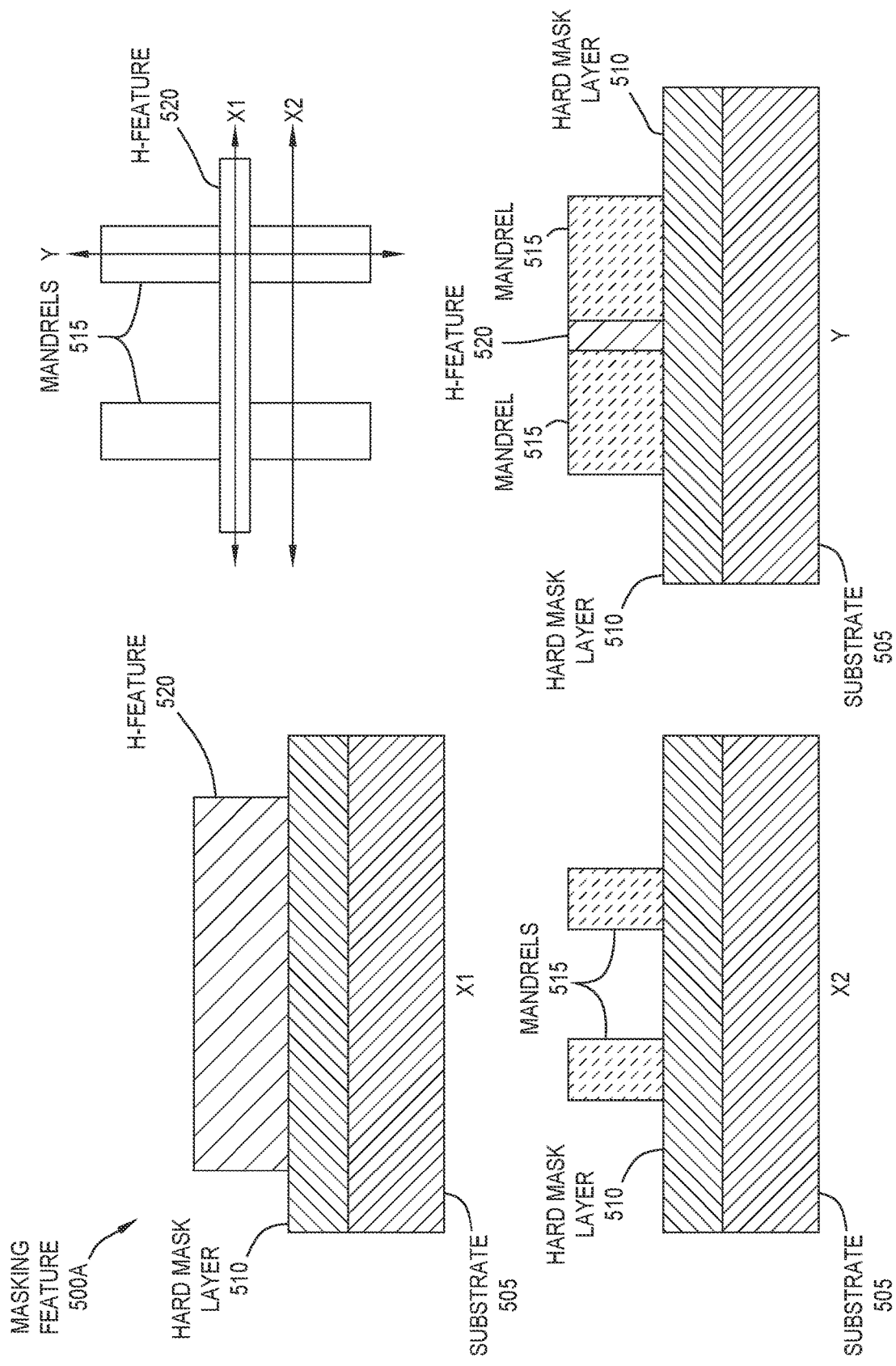
FIGS. 5A-5F illustrate forming a crossbar VFET, according to embodiments herein.

FIG. 5A illustrates a masking feature 500A as shown by the top down view in the upper right of the figure. Other views of the masking feature 500A are shown that correspond to the X1, X2, and Y cross sections. In this example, the masking feature 500A includes an H-feature 520 that extends through the middle of mandrels 515. For example, the H-feature 520 may be formed first, and then the mandrels 515 can be formed on the upper and lower sides of the H-feature 520. Moreover, relative to the top down view, the H-feature 520 has a length along the X direction that is longer than a length of the mandrels 515. In one embodiment, the mandrels 515 are amorphous SiGe and the H-feature is SiN.

While FIG. 5A illustrates the H-feature 520 extending through the middle of the mandrels 515, in other embodiments, the H-feature 520 may be shifted upwards or downwards such that it does not divide the mandrels 515 in half.

The masking feature 500A is disposed on a hard mask layer 510 which is in turn disposed on a substrate 505. As described below, the masking feature 500 can be used to etch the hard mask layer 510. The etched hard mask layer 510 can then be used to form a channel structure for a VFET in the substrate 505 (e.g., a semiconductor material). In one embodiment, the hard mask layer 510 is formed from SiOC.

Figure 5B:
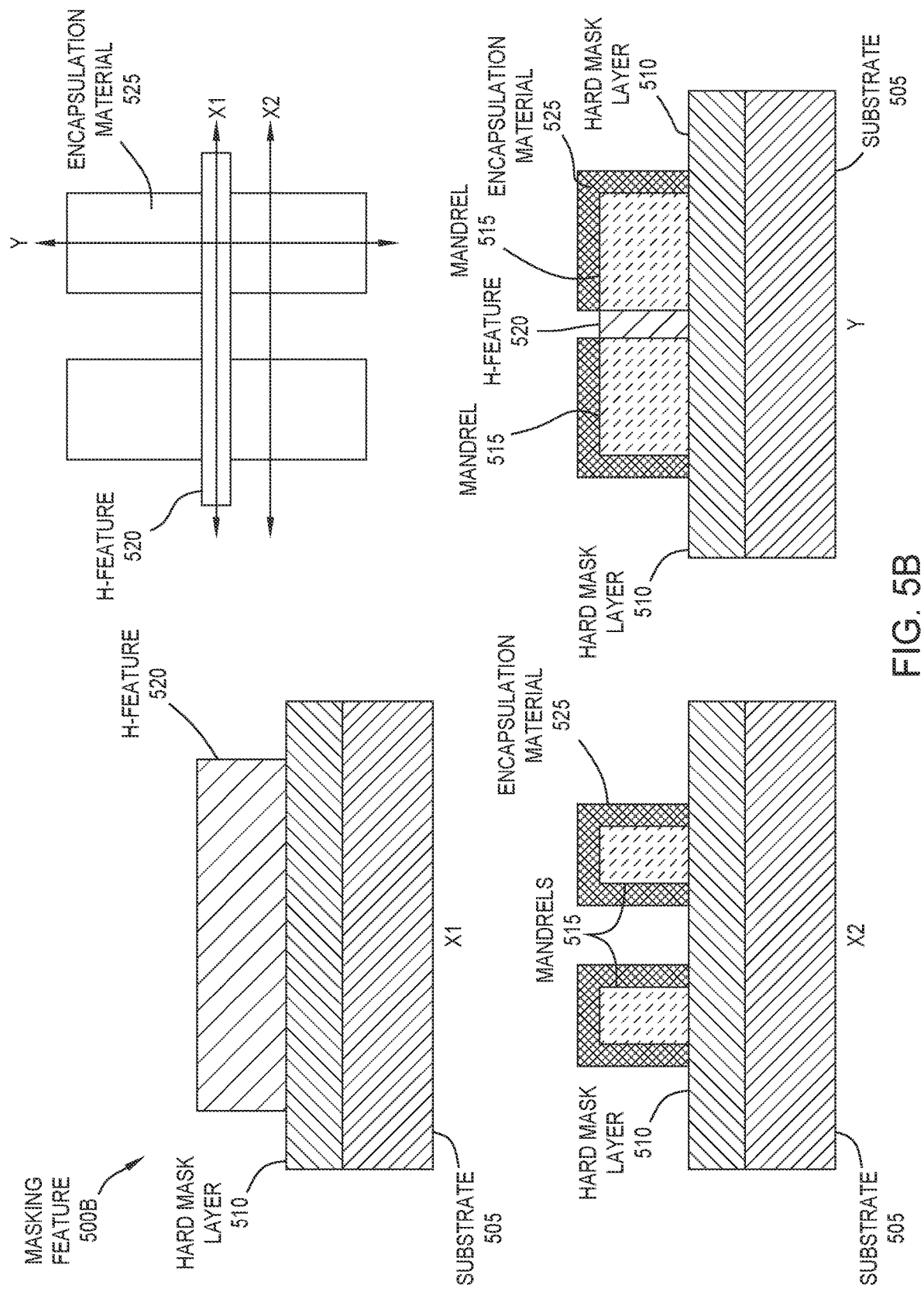

FIG. 5B illustrates a masking feature 500B where an encapsulation material 525 is deposited on top of the mandrels 515. However, the encapsulation material 525 is not above the H-feature 520. For example, the encapsulation material 525 may initially be deposited on top of the H-feature 520 but then can be removed so it is disposed only on the top and sides of the mandrels 515. In one embodiment, the encapsulation material 525 is amorphous silicon (a-Si).

Figure 5C:
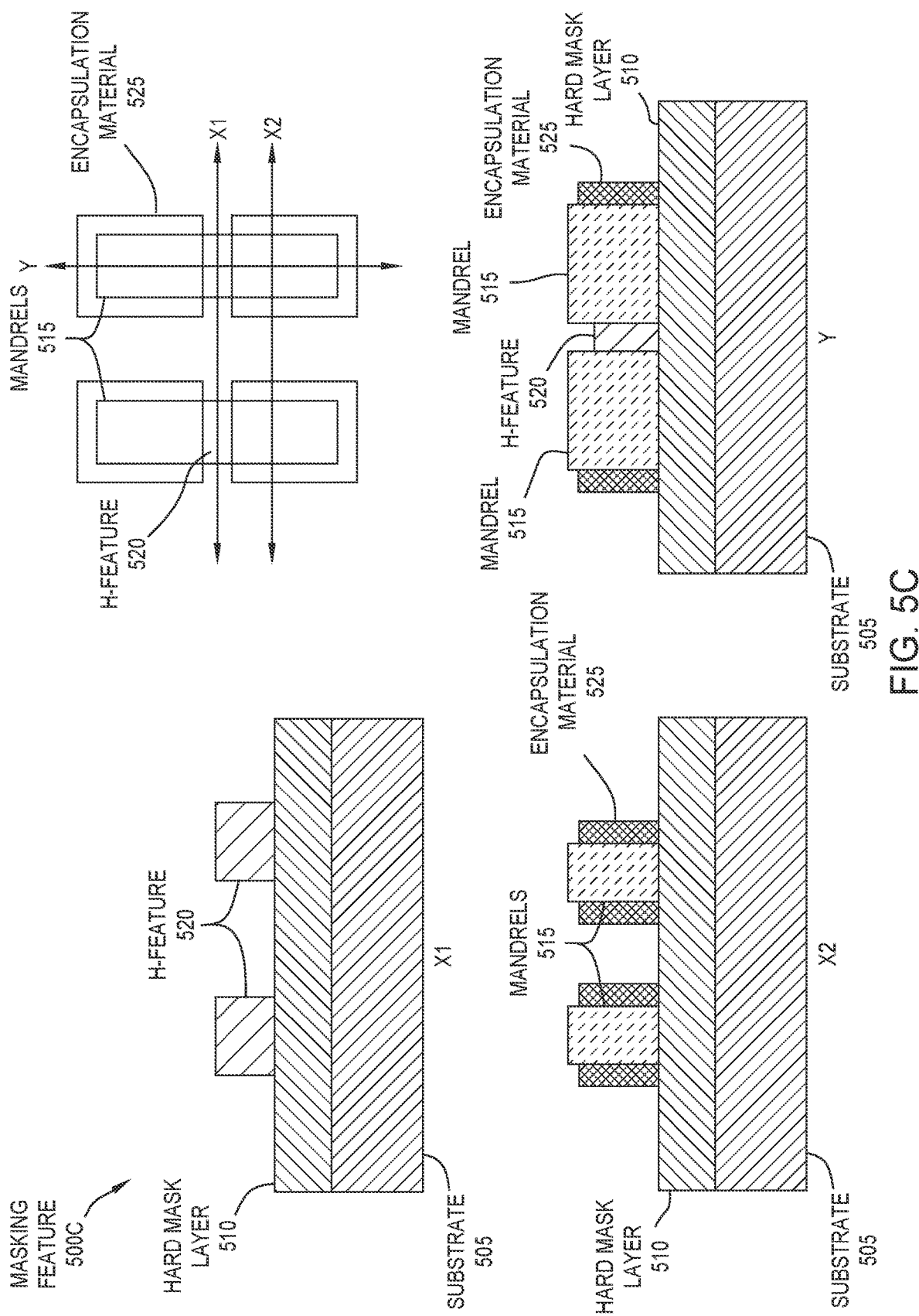

FIG. 5C illustrates a masking feature 500C where the encapsulation material 525 is removed from the top of the mandrels 515. That is, the encapsulation material 525 is now deposited only on the sides of the mandrels 515. Further, the top of the encapsulation material 525 may be slightly recessed from the top of the mandrels 515 such that the height of the encapsulation material 525 is smaller than the height of mandrels 515.

Further, the Y cross section illustrates that the height of the H-feature 520 has also been reduced. That is, in contrast to FIGS. 5A and 5B where the height of the H-feature 520 is the same as the height of the mandrels 515, in FIG. 5C the height of the H-feature 520 is now smaller than the height of the mandrels 515. Moreover, the height of the H-feature 520 is also less than the height of the encapsulation material 525 deposited on the sides of the mandrels 515.

FIG. 5C also illustrates reducing the length of the H-features 520. That is, in FIGS. 5A and 5B, the H-features 520 extended beyond the mandrels 515 in the X direction relative to the top down view. However, the H-features 520 have been shortened so that they now have a length that is equal to or less than length of the mandrels 515. Doing so creates gaps between the encapsulation material 525.

Figure 5D:
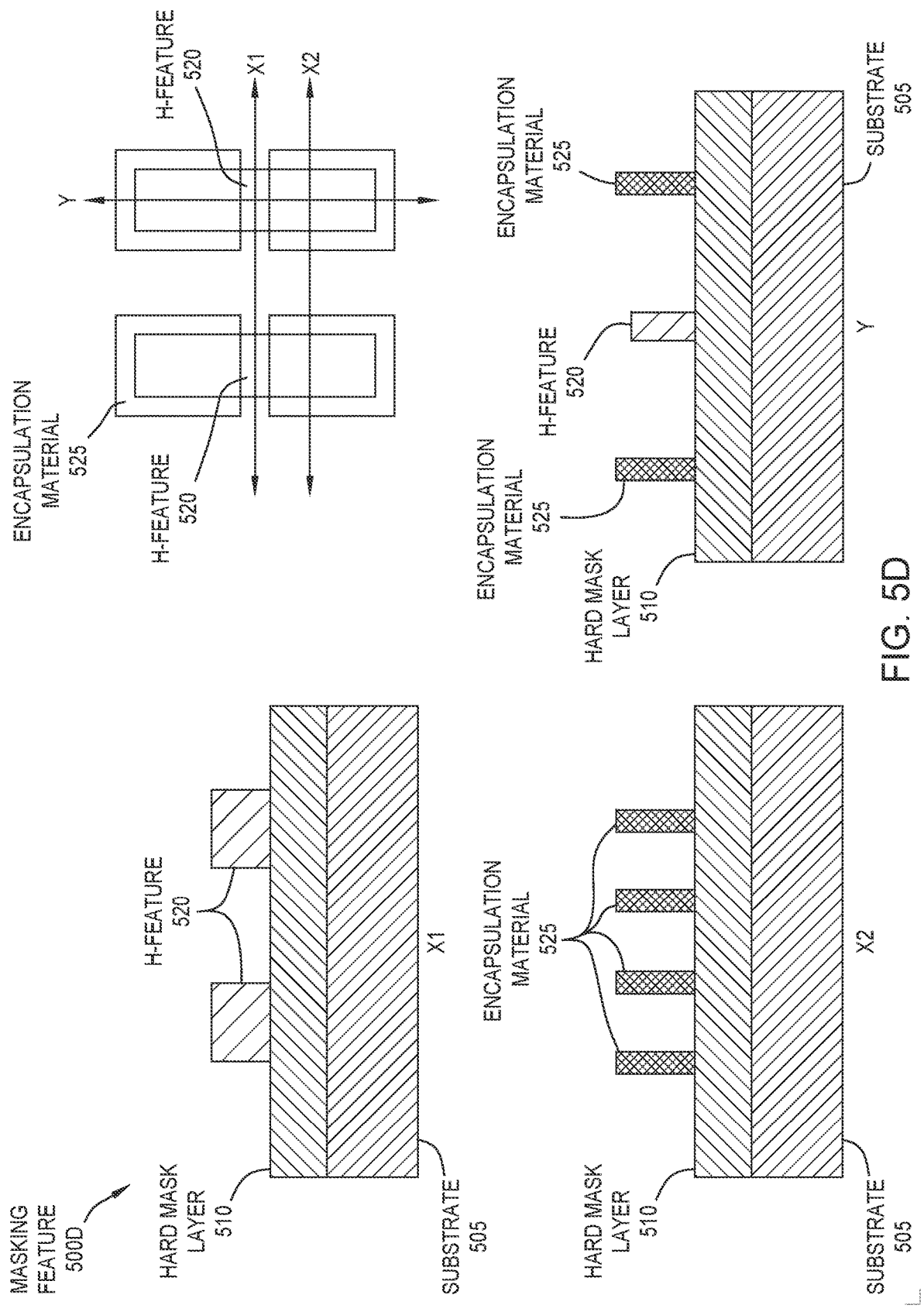

FIG. 5D illustrates a masking feature 500D where the mandrels 515 have been removed, leaving only the H-feature 520 and the encapsulation material 525.

Figure 5E:
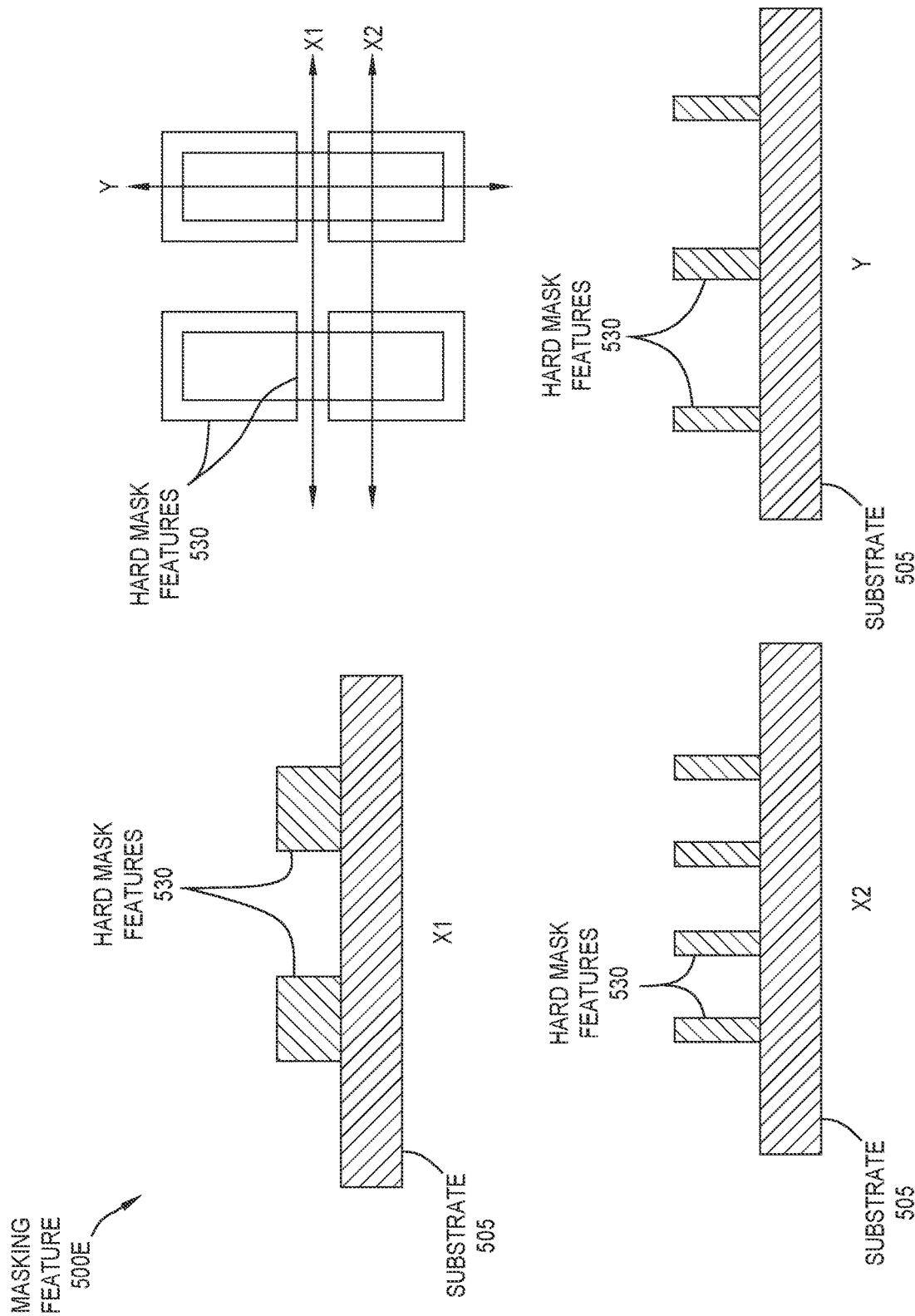

FIG. 5E illustrates using the masking feature 500D in FIG. 5D to form hard mask features 530. That is, the hard mask features 530 form the same shape as the masking feature 500D. While it may be possible to form the masking feature 500D directly on the substrate 505 (rather than the hard mask layer 510 as shown in the previous figures), forming the masking feature 500D on the hard mask layer 510 means various etches can be performed without affecting the substrate 505. That is, the hard mask layer 510 protects the substrate 505 while the masking feature 500 is being constructed. Once the masking feature 500 is finished, it can then be used to etch the hard mask layer 510 to form the hard mask features 530, which mirror the masking feature 500.

Figure 5F:
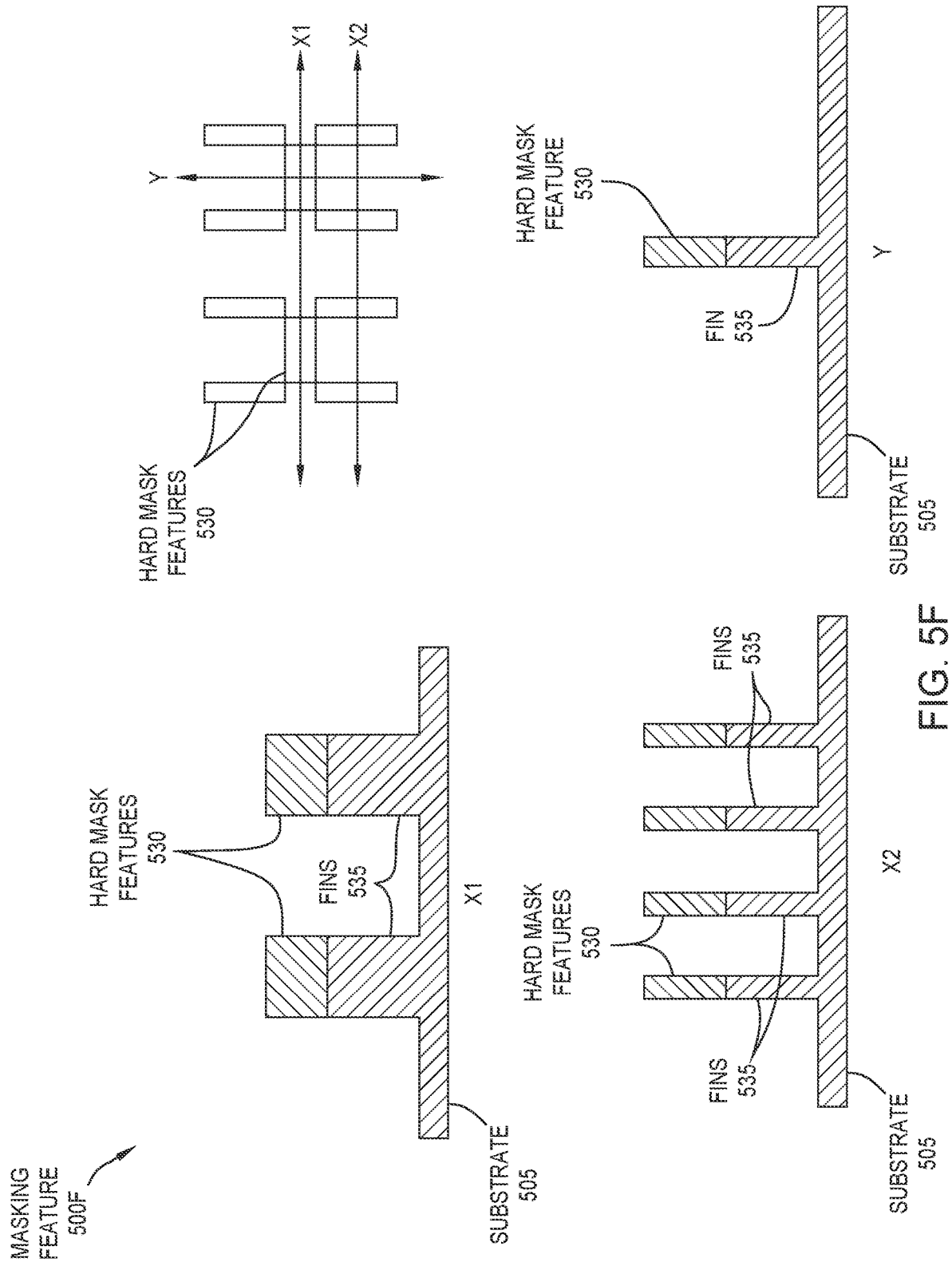

FIG. 5F illustrates etching the substrate 505 to form fins 535 of the channel structure. The fins 535 have the same shape and structure as the hard mask features 530. Thus, the fins 535 have vertical channels/fins (like the vertical channels 105 in FIG. 1D) with gaps (e.g., gaps 140) where a horizontal channel/fin (like the horizontal channel 110) aligns with the gaps. In this manner, the FIGS. 5A-5F can be used to form the channel structure 110D in FIG. 1D.

Although not shown, the fins 535 (or channels) can be connected to S/D regions. For example, using later processing steps, a top of the fins 535 can be connected to either a source or drain region. The bottom of the fins 535 can be connected to the other type of region. For example, if the tops of the fins 535 are connected to a source region, than the bottoms of the fins 535 are connected to a drain region, and vice versa. In one embodiment, the fins 535 can be all be connected to the same source and drain regions to form a single VFET. That is, the fins 535 can be part of the same device or FET.

FIGS. 6A-6C illustrate forming a masking feature 600 for forming channels in a crossbar VFET, according to embodiments herein. As shown in FIG. 6A, a masking feature 600A has two sets of concentric circles where layer 610 forms outer circles, spacers 615 form middle circles, and mandrels 620 form an inner circle. Moreover, the circles formed by the layer 610 are connected to form a figure eight with an X-shaped structure in the middle of the figure eight where the two circles intersect. FIG. 6A also illustrates a side view of the masking feature 600A along a Y cross section.

In this embodiment, the masking feature 600A is deposited on a hard mask substrate 605. This substrate 605 is in turn deposited on a semiconductor substrate 625.

FIG. 6B illustrates a masking feature 600B where the spacers 615 and the mandrels 620 have been removed, leaving only the layer 610. Like in FIGS. 5A-5F, the masking feature 600 can be used to form an intermediate mask in the hard mask substrate 605 which can then be used to form the fins in the underlying semiconductor substrate 625. This is shown in FIG. 6C where the masking feature 600B is used to form a hard mask feature 630 which has a similar structure as the masking feature 600B. Although not shown, the hard mask feature 630 can then be used to etch the semiconductor substrate 625 to form a channel or fin structure with a pattern similar to the pattern of the masking feature 600B.

As shown, the hard mask feature 630 includes two U-shapes where one of the U-shapes is flipped so that the bottoms of the U-shapes are connected. These intersecting bottoms of the U-shapes can form a X-shape. Like the channel structures in FIGS. 1A-1D, a channel structure having the shape shown in FIG. 6C does not have rounded corners, and thus, has the same advantages discussed above. That is, the channel structure with the shape shown in FIG. 6C has the benefit of having vertical channel features 635 and horizontal channel features 640 to increase channel area but without the drawbacks that come with having rounded corners.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A vertical field effect transistor (VFET), comprising:
a first vertical channel;
a second vertical channel, wherein the first and second vertical channels extend in a first direction;
a horizontal channel disposed between the first and second vertical channels and extending in a second direction substantially perpendicular to the first direction, wherein the horizontal channel comprises:
a first end, wherein the first end and the first vertical channel are separated by a first gap; and
a second end opposite the first end, wherein the second end and the second vertical channel are separated by a second gap that is different than the first gap, and wherein the first end is closer to the first vertical channel than the second end; and
a source region and a drain region coupled to the first and second vertical channels.

2. The VFET of claim 1, wherein the first and second gaps are between the first and second ends of the horizontal channel and respective sides of the first and second vertical channels.

3. The VFET of claim 1, wherein the first and second gaps are between upper portions and lower portions of the first and second vertical channels, wherein the horizontal channel is aligned with the first and second gaps.

4. The VFET of claim 1, wherein the first and second vertical channels and the horizontal channel form an H-shape in a top down view.

5. The VFET of claim 1, wherein the first and second vertical channels and the horizontal channel comprise a semiconductor material.

6. A vertical field effect transistor (VFET), comprising:
a first vertical channel;
a second vertical channel, wherein the first and second vertical channels extend in a first direction;
a horizontal channel disposed between the first and second the vertical channels and extending in a second direction substantially perpendicular to the first direction, wherein the horizontal channel comprises:
a first end;
a second end opposite the first end; and
a middle portion centered relative to the first and second ends, wherein the first end contacts the first vertical channel, where the second end contacts the second vertical channel, and wherein the first and second ends have a reduced width relative to a width of the middle portion; and
a source region and a drain region coupled to the first and second vertical channels.

7. The VFET of claim 6, wherein the first and second vertical channels and the horizontal channel form an H-shape in a top down view.

8. The VFET of claim 6, wherein the horizontal channel comprises notches at the first and second ends.

9. The VFET of claim 6, wherein the first and second vertical channels and the horizontal channel are fins of the VFET.

* * * * *